United States Patent
Masaki

(10) Patent No.: US 12,480,725 B2
(45) Date of Patent: Nov. 25, 2025

(54) RADIATOR AND HEAT SINK

(71) Applicant: Mitsubishi Electric Corporation, Tokyo (JP)

(72) Inventor: Motoki Masaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 220 days.

(21) Appl. No.: 18/286,762

(22) PCT Filed: Apr. 21, 2021

(86) PCT No.: PCT/JP2021/016119
§ 371 (c)(1),
(2) Date: Oct. 13, 2023

(87) PCT Pub. No.: WO2022/224368
PCT Pub. Date: Oct. 27, 2022

(65) Prior Publication Data
US 2024/0191954 A1    Jun. 13, 2024

(51) Int. Cl.
*F28F 21/04* (2006.01)
*C04B 35/453* (2006.01)
*C04B 111/00* (2006.01)

(52) U.S. Cl.
CPC ............ *F28F 21/04* (2013.01); *C04B 35/453* (2013.01); *C04B 2111/0025* (2013.01);
(Continued)

(58) Field of Classification Search
CPC .... F28F 21/04; F28F 2245/06; F28F 2255/18; C04B 35/453; C04B 2111/0025; C04B 2111/00465
(Continued)

(56) References Cited

U.S. PATENT DOCUMENTS

2002/0018885 A1* 2/2002 Takahashi ............ C10M 113/06
524/786
2013/0160980 A1* 6/2013 Chen ........................ F28F 1/40
165/185
(Continued)

FOREIGN PATENT DOCUMENTS

CN    101164966 A    4/2008
JP    2007-310223 A    11/2007
(Continued)

OTHER PUBLICATIONS

Office Action mailed on Mar. 6, 2025, for the corresponding Chinese patent application No. 202180097094.7 and an English machine translation thereof, 19pp.
(Continued)

*Primary Examiner* — Joel M Attey
(74) *Attorney, Agent, or Firm* — XSENSUS LLP

(57) ABSTRACT

A radiator includes a heat radiation ceramic material. The heat radiation ceramic material includes a first metal oxide as a principal component, the first metal oxide being a metal oxide having a wurtzite crystal structure; and a second metal oxide as a metal oxide having an average emissivity higher than or equal to 70% in a wavelength range of 3 μm to 25 μm inclusive. At least one of a trivalent metal-doped metal oxide where some metal atoms of the first metal oxide are substituted with trivalent metal atoms and a monovalent metal-doped metal oxide where some metal atoms of the first metal oxide are substituted with monovalent metal atoms is included as the second metal oxide.

16 Claims, 7 Drawing Sheets

(52) U.S. Cl.
CPC . *C04B 2111/00465* (2013.01); *F28F 2245/06* (2013.01); *F28F 2255/18* (2013.01)

(58) Field of Classification Search
USPC .......................................................... 165/185
See application file for complete search history.

(56) References Cited

U.S. PATENT DOCUMENTS

| | | | |
|---|---|---|---|
| 2013/0220676 | A1 | 8/2013 | Kawaguchi et al. |
| 2013/0288149 | A1* | 10/2013 | Higashi ............... H01M 8/2425 |
| | | | 429/452 |
| 2014/0020882 | A1* | 1/2014 | Konishi ................ F21S 41/141 |
| | | | 165/185 |
| 2016/0242272 | A1 | 8/2016 | Kawaguchi et al. |
| 2021/0139378 | A1* | 5/2021 | Song ................... C04B 35/4885 |
| 2022/0196349 | A1* | 6/2022 | Biglari ................. C09D 133/12 |
| 2022/0357116 | A1* | 11/2022 | Yang ..................... H10F 77/311 |

FOREIGN PATENT DOCUMENTS

| | | |
|---|---|---|
| JP | 2008159990 A | 7/2008 |
| JP | 2012-119671 A | 6/2012 |
| JP | 2013-144747 A | 7/2013 |
| JP | 2019-151881 A | 9/2019 |
| JP | 2021044403 A | 3/2021 |

OTHER PUBLICATIONS

International Search Report and Written Opinion mailed on Jul. 13, 2021, received for PCT Application PCT/JP2021/016119, filed on Apr. 21, 2021, 8 pages including English Translation.

Office Action mailed on Jul. 30, 2025 for the corresponding Chinese patent application No. 202180097094.7 and an English machine translation, 15pp.

* cited by examiner

FIG.12

| | | Examples | | | | | | | | | | Comparative Examples | |
|---|---|---|---|---|---|---|---|---|---|---|---|---|---|
| | | 1 | 2 | 3 | 4 | 5 | 6 | 7 | 8 | 9 | 10 | 1 | 2 |
| MATERIALS | ZnO [MASS%] | 97.43 | 99.87 | 99.34 | 93.81 | 91.55 | 98.59 | 99.90 | 95.44 | 94.58 | 96.09 | 100 | 0 |
| | $Al_2O_3$ [MASS%] | 2.57 | 0.13 | 0.66 | 6.19 | 8.45 | 0 | 0 | 0 | 0 | 2.53 | 0 | 100 |
| | $Li_2CO_3$ [MASS%] | 0 | 0 | 0 | 0 | 0 | 1.41 | 0.10 | 4.56 | 5.42 | 1.38 | 0 | 0 |
| | DISPERSANT [PARTS BY MASS RELATIVE TO 100 PARTS BY MASS OF BASE POWDER] | 1 | 1 | 1 | 1 | 1 | 1 | 1 | 1 | 1 | 1 | 1 | 1 |
| | BINDER [PARTS BY MASS RELATIVE TO 100 PARTS BY MASS OF BASE POWDER] | 1 | 1 | 1 | 1 | 1 | 1 | 1 | 1 | 1 | 1 | 1 | 1 |
| | WATER [PARTS BY MASS RELATIVE TO 100 PARTS BY MASS OF BASE POWDER] | 50 | 50 | 50 | 50 | 50 | 50 | 50 | 50 | 50 | 50 | 50 | 50 |
| HEAT RADIATION CERAMIC MATERIAL | AMOUNT OF TRIVALENT METAL SUBSTITUTION [mol%] | 2 | 0.1 | 0.5 | 5 | 7 | 0 | 0 | 0 | 0 | 2 | 0 | 0 |
| | AMOUNT OF MONOVALENT METAL SUBSTITUTION [mol%] | 0 | 0 | 0 | 0 | 0 | 3 | 0.2 | 10 | 12 | 3 | 0 | 0 |
| | POROSITY [%] | 1.3 | 0.8 | 1.0 | 7.3 | 10.7 | 3.4 | 1.1 | 15.8 | 18.9 | 3.8 | 0.5 | 0.8 |
| HEAT RADIATION PERFORMANCE | AVERAGE EMISSIVITY [%] IN WAVELENGTH RANGE OF 3 μm TO 25 μm INCLUSIVE | 79 | 73 | 75 | 76 | 73 | 73 | 70 | 72 | 71 | 83 | 61 | 54 |
| | COOLING PERFORMANCE OF HEAT RADIATION MEMBER (SATURATION TEMPERATURE [°C] FOR POWER INPUT OF 20W) | 120 | 132 | 126 | 125 | 133 | 132 | 139 | 135 | 136 | 116 | 154 | 162 |

RADIATOR AND HEAT SINK

CROSS-REFERENCE TO RELATED APPLICATIONS

The present application is based on PCT filing PCT/JP2021/016119, filed Apr. 21, 2021, the entire contents of which are incorporated herein by reference.

FIELD

The present disclosure relates to a radiator and a heat sink that are used for radiating heat in electrical equipment and electronic equipment.

BACKGROUND

For electrical and electronic equipment equipped with a heat-generating component such as a light-emitting diode (LED) element or an integrated circuit (IC), heat dissipation technology is of increasing importance due to increased heat generation caused by increased output power. Specifically, heat dissipation through air convection is problematically difficult for onboard electrical equipment that is used in an enclosure sealed against dust and water, space equipment that is used in a vacuum, and others. Therefore, conventional heat dissipation techniques such as natural air cooling using an aluminum heat sink and forced air cooling using an electric fan do not produce sufficient heat dissipation effects. When it comes to information devices that, including laptop personal computers, tend to generate increased heat due to higher central processing unit (CPU) performance, progress has been made toward downsizing and higher-density mounting, problematically making it difficult to secure a space for accommodating the large-volume aluminum heat sink. Furthermore, the conventional aluminum heat sink is metallic and thus causes electromagnetic noise that may cause a malfunction in the electrical and electronic equipment. Therefore, in recent years, ceramic heat sinks that utilize infrared heat radiation have gained attention, targeting electrical and electronic equipment for which heat dissipation measures are difficult.

A radiator proposed in Patent Literature 1 absorbs and radiates out heat generated by an electronic device. The radiator described in Patent Literature 1 includes a base and a coating covering at least a portion of a surface of the base. The coating is a metal oxide film that includes at least one of a metal oxide represented by $M_xL_{3-x}O_4$ or ZnO and is of porous structure in which plural needle-shaped or plate-shaped crystalline bodies are arranged in a mesh or frog shape used for flower arrangement. It is noted that in $M_xL_{3-x}O_4$, M≠L, M is selected from the group consisting of Mg, Fe, Zn, Mn, Cu, Co, Cr, and Ni, L is selected from the group consisting of Co, Al, Fe, and Cr, and x satisfies $0<x\leq1$.

CITATION LIST

Patent Literature

Patent Literature 1: Japanese Patent Application Laid-open No. 2019-151881

SUMMARY OF INVENTION

Problem to be Solved by the Invention

When infrared heat radiation of a ceramic heat sink is to be utilized, an average emissivity of 70% or higher is desirable in a wavelength range of 3 µm to 25 µm inclusive. However, while the radiator described in Patent Literature 1 has an emissivity of 80% or higher in a wavelength range of 2 µm to 15 µm inclusive, its emissivity drops sharply in a range of wavelengths longer than 15 µm. Therefore, the radiator described in Patent Literature 1 insufficiently radiates heat in the range of wavelengths longer than 15 µm, so an average emissivity of 70% or higher is difficult to achieve in the wavelength range of 3 µm to 25 µm inclusive. In other words, when used as a radiator or a ceramic heat sink for electrical and electronic equipment, the radiator described in Patent Literature 1 may not provide sufficient cooling performance and thus is required to improve its emissivity across the wider wavelength range.

The present disclosure has been made in view of the above, and an object of the present disclosure is to obtain a radiator that can provide improved cooling performance for electrical and electronic equipment compared to conventional ones.

Means to Solve the Problem

To solve the above described problems and achieve the object a radiator according to the present disclosure includes a heat radiation ceramic material. The heat radiation ceramic material includes: a first metal oxide as a principal component, the first metal oxide is a metal oxide having a wurtzite crystal structure; and a second metal oxide as a metal oxide having an average emissivity higher than or equal to 70% in a wavelength range of 3 µm to 25 µm inclusive. The second metal oxide includes at least one of a trivalent metal-doped metal oxide where some metal atoms of the first metal oxide are substituted with trivalent metal atoms and a monovalent metal-doped metal oxide where some metal atoms of the first metal oxide are substituted with monovalent metal atoms.

Effects of the Invention

The present disclosure has an advantage over conventional ones in that cooling performance is improved for electrical and electronic equipment.

BRIEF DESCRIPTION OF DRAWINGS

FIG. 12 is a diagram illustrating example materials, example heat radiation ceramic materials, and example heat radiation characteristics of radiators according to Examples 1 to 10 and Comparative Examples 1 and 2.

DESCRIPTION OF EMBODIMENTS

With reference to the drawings, a detailed description is hereinafter provided of radiators and heat sinks according to embodiments of the present disclosure.

First Embodiment

Figure 1:
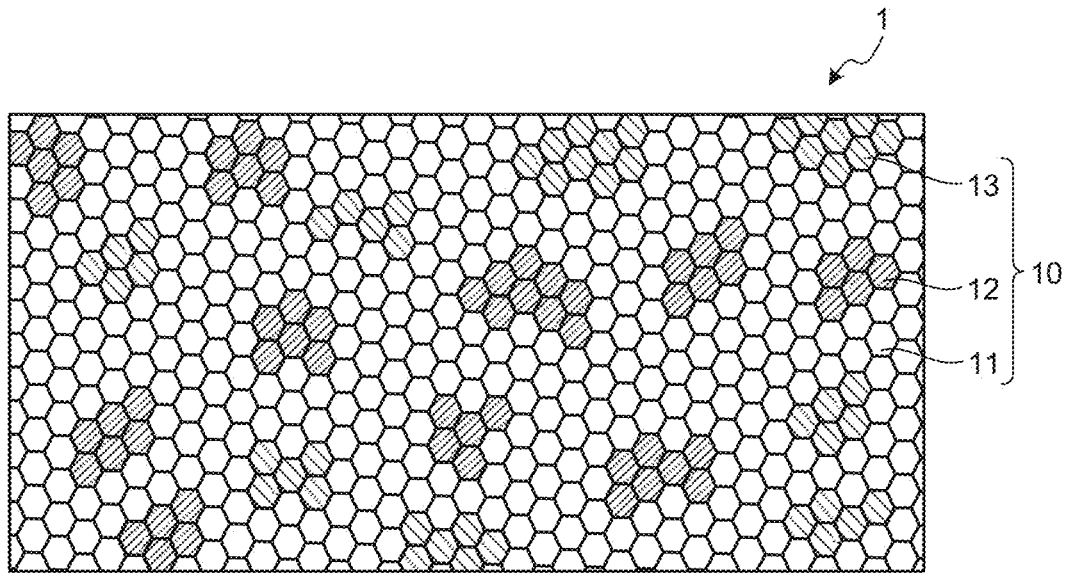
FIG. 1 is a sectional view schematically illustrating an example of a radiator according to a first embodiment.

FIG. 1 is a sectional view schematically illustrating an example of a radiator according to a first embodiment. The radiator 1 is made of a heat radiation ceramic material 10 containing metal oxide particles 11, trivalent metal-doped metal oxide particles 12, and monovalent metal-doped metal oxide particles 13. In FIG. 1, the metal oxide particles 11 correspond to first metal oxide particles, and the trivalent metal-doped metal oxide particles 12; and the monovalent metal-doped metal oxide particles 13 correspond to second metal oxide particles.

The radiator 1 made of the heat radiation ceramic material 10 exhibits a cooling effect by radiating out heat generated by a heat source such as a semiconductor element through infrared radiation. Therefore, it is desirable for the heat radiation ceramic material 10 to have as high an emissivity as possible. However, the emissivity of a ceramic material is determined by a radiation spectrum unique to an electronic structure of each substance, and there are a higher-emissivity wavelength range and a lower-emissivity wavelength range. Therefore, it is generally difficult for a single ceramic material to have a high average emissivity, an average of emissivities in all the infrared wavelength ranges. Given this, the heat radiation ceramic material 10 used for the radiator 1 according to the first embodiment includes the metal oxide particles 11 as a principal component and at least one of the trivalent metal-doped metal oxide particles 12 and the monovalent metal-doped metal oxide particles 13. The metal oxide particles 11 have a wurtzite crystal structure having a relatively high emissivity. The trivalent metal-doped metal oxide particles 12 and the monovalent metal-doped metal oxide particles 13 have different radiation spectra. Thus relatively high thermal emissivities can be obtained in all infrared wavelength ranges targeted, realizing an increased average emissivity. While the inclusion of either the trivalent metal-doped metal oxide particles 12 or the monovalent metal-doped metal oxide particles 13 has an average emissivity improvement effect, the inclusion of both the trivalent metal-doped metal oxide particles 12 and the monovalent metal-doped metal oxide particles 13 is preferable from the perspective of further improvement of the average emissivity. An infrared range targeted herein is a wavelength range of 3 μm to 25 μm inclusive. The average emissivity refers to an average of emissivities in the infrared wavelength range of 3 μm to 25 μm inclusive.

Figure 2:
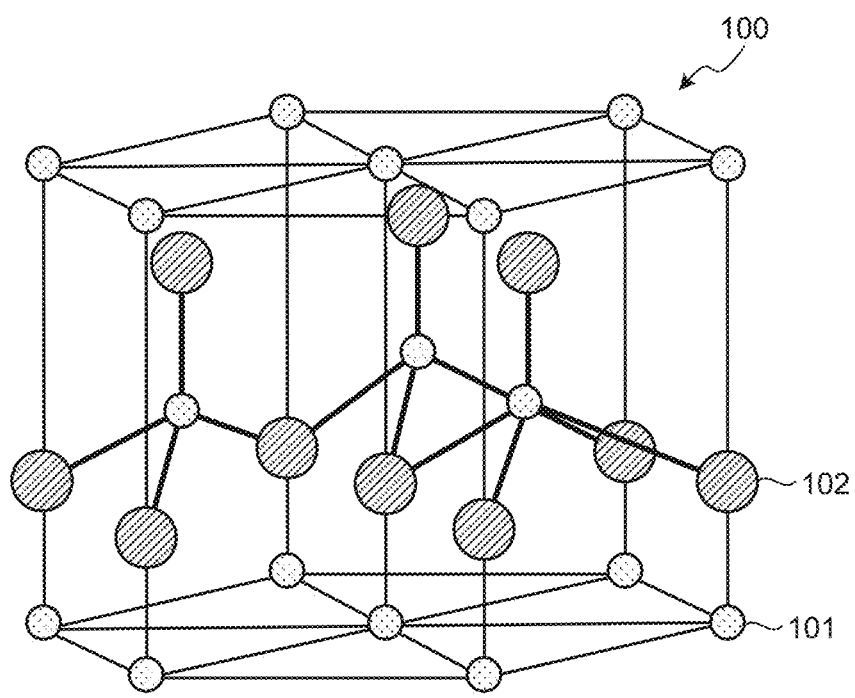
FIG. 2 is a diagram schematically illustrating an example of a wurtzite crystal structure.

The heat radiation ceramic material 10 used for the radiator 1 contains the metal oxide particles 11 as the principal component. The metal oxide particles 11 contain a metal oxide having the wurtzite crystal structure. FIG. 2 is a diagram schematically illustrating an example of the wurtzite crystal structure. The metal oxide 100 has the wurtzite crystal structure in which metal atom 101 and oxygen atom 102 are combined in a ratio of 1:1 in an ordered arrangement. The metal oxide 100 having the wurtzite crystal structure is hereinafter referred to as the wurtzite-type metal oxide 100. The wurtzite-type metal oxide 100 has an electronic structure that provides the high emissivity in an infrared range and thus is suitable for the heat radiation ceramic material 10. The wurtzite-type metal oxide 100 is, for example, beryllium oxide (BeO) or zinc oxide (ZnO). From the perspective of costs and ease of production, ZnO is preferable to BeO as the wurtzite-type metal oxide 100. The wurtzite-type metal oxide 100 corresponds to the first metal oxide.

Figure 3:
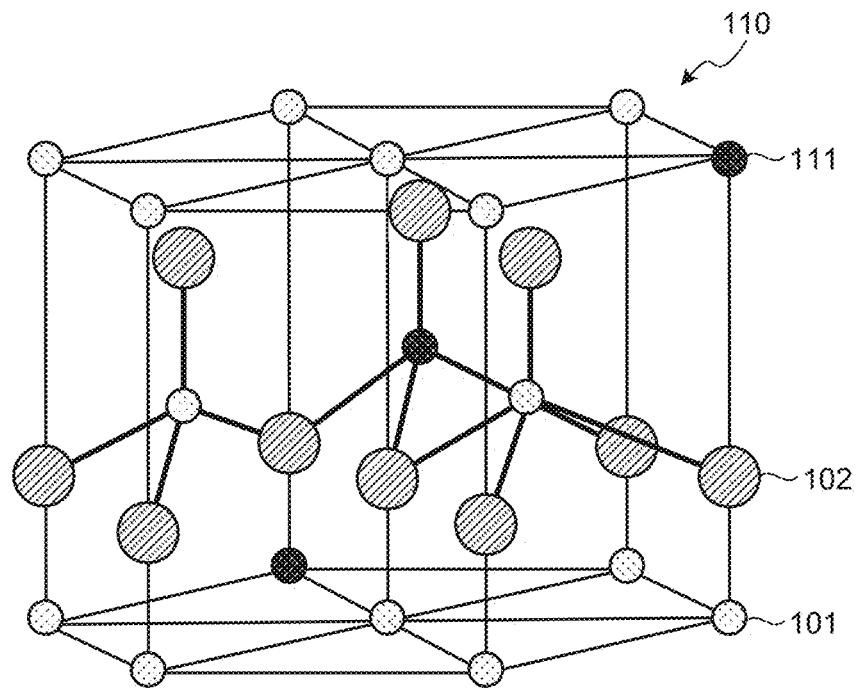
FIG. 3 is a diagram schematically illustrating an example of a trivalent metal-doped metal oxide crystal structure.

As described above, the heat radiation ceramic material 10 used for the radiator 1 preferably includes the at least one of the trivalent metal-doped metal oxide particles 12 and the monovalent metal-doped metal oxide particles 13. The trivalent metal-doped metal oxide particles 12 contain a trivalent metal-doped metal oxide. FIG. 3 is a diagram schematically illustrating an example of a trivalent metal-doped metal oxide crystal structure. As illustrated in FIG. 3, the trivalent metal-doped metal oxide 110 is where some of the metal atoms 101 of the wurtzite-type metal oxide 100 are substituted with trivalent metal atoms 111. The inclusion of the trivalent metal-doped metal oxide 110 results in an altered electronic structure of the wurtzite-type metal oxide 100, thus improving the emissivity on a shorter-wavelength side of the 3 μm to 25 μm wavelength range, namely at wavelengths of up to 10 μm. With the emissivity improved on the shorter-wavelength side where energy is higher, improved overall heat radiation of the radiator 1 can be expected. Furthermore, the inclusion of the trivalent metal-doped metal oxide 110 in the radiator 1 increases carriers that transfer heat, enabling a thermal conductivity improvement effect to be expected from the radiator 1. The trivalent metal-doped metal oxide 110 corresponds to the second metal oxide.

The trivalent metal atoms 111 are preferably aluminum (Al) or gallium (Ga). From the economical perspective, the trivalent metal atoms 111 are more preferably Al. Al or Ga, if used, can substitute for the metal atoms 101 in the wurtzite-type metal oxide 100. Particularly when the wurtzite-type metal oxide 100 is ZnO, Al or Ga can be substituted for the metal atoms 101, which are Zn, with relative ease, improving productivity. The trivalent metal atoms 111 are substituted for in a non-limiting amount but preferably in an amount ranging from 0.1 mol % to 5 mol % (inclusive) or more preferably in an amount ranging from 0.2 mol % to 3 mol % (inclusive). If the trivalent metal atoms 111 substitute in such a range, the shorter wavelength-side emissivity improvement effect is enhanced further, which is preferable.

Figure 4:
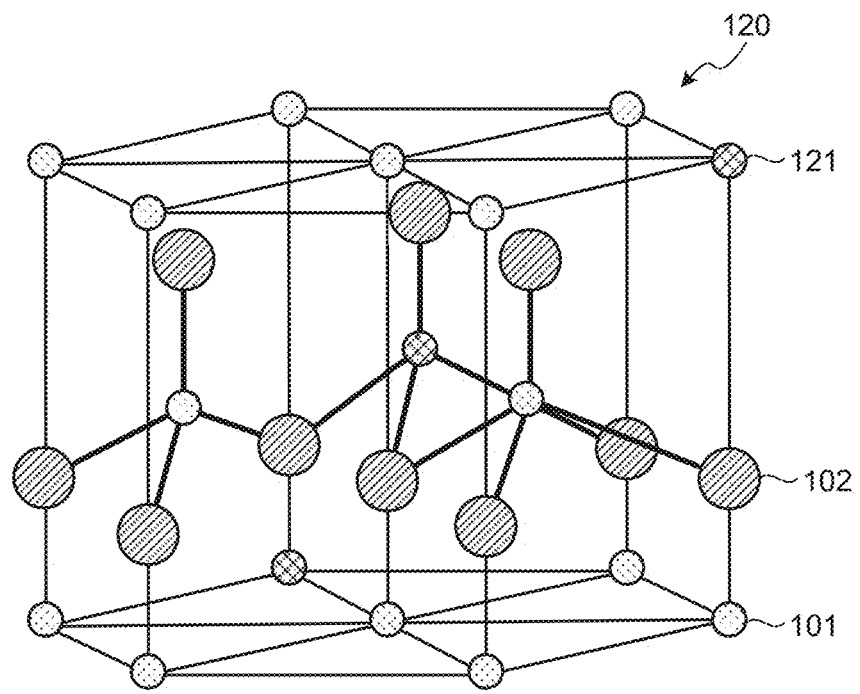
FIG. 4 is a diagram schematically illustrating an example of a monovalent metal-doped metal oxide crystal structure.

The monovalent metal-doped metal oxide particles 13 contain a monovalent metal-doped metal oxide. FIG. 4 is a diagram schematically illustrating an example of a monovalent metal-doped metal oxide crystal structure. As illustrated in FIG. 4, the monovalent metal-doped metal oxide 120 is where some of the metal atoms 101 of the wurtzite-type metal oxide 100 are substituted with monovalent metal atoms 121. The inclusion of the monovalent metal-doped metal oxide 120 results in an altered electronic structure of the wurtzite-type metal oxide 100, thus improving the emissivity on a longer-wavelength side of the 3 μm to 25 μm wavelength range, namely at wavelengths of 10 μm and above. The monovalent metal-doped metal oxide 120 corresponds to the second metal oxide.

The monovalent metal atoms 121 are preferably lithium (Li) or sodium (Na). Li or Na, if used, can substitute for the metal atoms 101 in the wurtzite-type metal oxide 100. Particularly when the wurtzite-type metal oxide 100 is ZnO, Li or Na can be substituted for the metal atoms 101, which are Zn, with relative ease, improving the productivity. The monovalent metal atoms 121 are substituted for in a non-limiting amount but preferably in an amount ranging from 0.2 mol % to 10 mol % (inclusive) or more preferably in an amount ranging from 0.5 mol % to 8 mol % (inclusive). If the monovalent metal atoms 121 substitute in such a range, the longer wavelength-side emissivity improvement effect is enhanced further, which is preferable.

It is to be noted here that the trivalent metal-doped metal oxide 110 and the monovalent metal-doped metal oxide 120 each have an average emissivity of 70% or higher in the infrared wavelength range of 3 μm to 25 μm inclusive. The inclusion of the trivalent metal-doped and monovalent metal-doped metal oxides 110 and 120 that both have the emissivity of 70% or higher results in the radiator 1, of which the heat radiation ceramic material 10 has a higher average emissivity.

In cases where the radiator 1 includes both the trivalent metal-doped and monovalent metal-doped metal oxides 110 and 120, the emissivity improves on both the shorter-wavelength and longer-wavelength sides of 10 μm as a boundary, enabling even higher heat radiation performance to be expected.

The heat radiation ceramic material 10 is illustrated in FIG. 1 as an example of a sintered body in which the trivalent metal-doped metal oxide particles 12 and the monovalent metal-doped metal oxide particles 13 are scattered among the wurtzite-type metal oxide particles 11.

Figure 5:
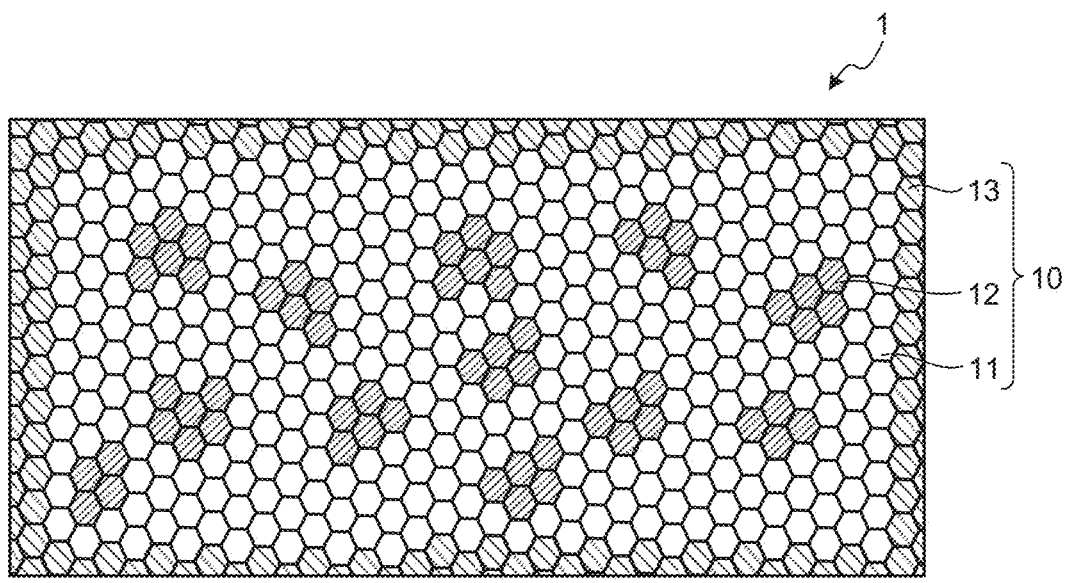
FIG. 5 is a sectional view schematically illustrating another example of the radiator according to the first embodiment.
Figure 6:
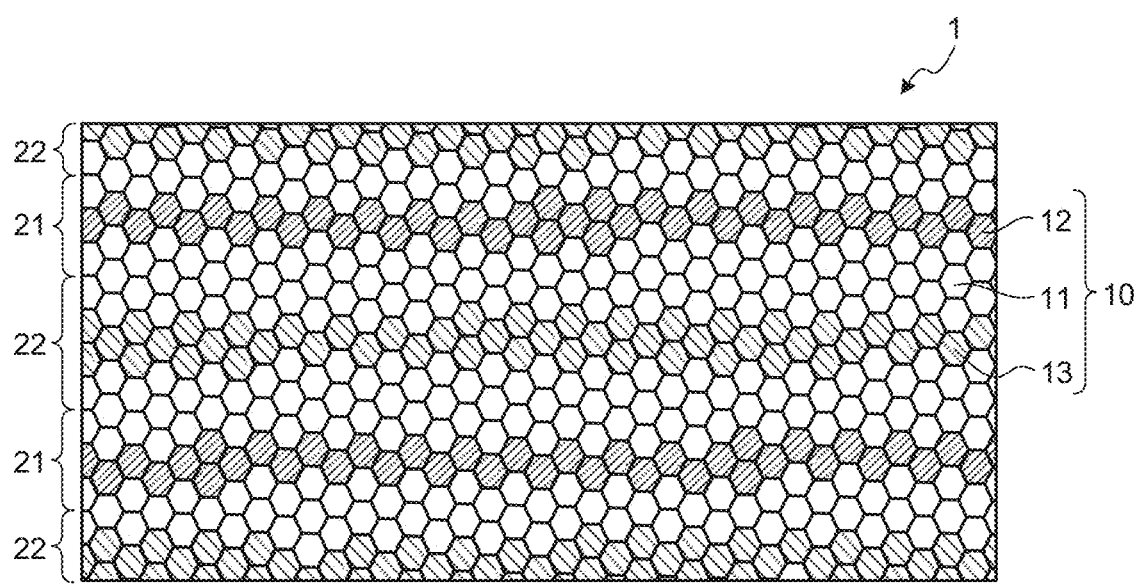
FIG. 6 is a sectional view schematically illustrating another example of the radiator according to the first embodiment.

FIGS. 5 and 6 are sectional views schematically illustrating other examples of the radiator according to the first embodiment. Constituent elements identical with those in FIG. 1 have the same reference characters and are not described. As long as the radiator 1 can enjoy the average emissivity improvement effect, the radiator 1 may be the sintered body of the heat radiation ceramic material 10 in which the trivalent metal-doped metal oxide particles 12 and the monovalent metal-doped metal oxide particles 13 are randomly scattered, as illustrated in FIG. 1.

As illustrated in FIG. 5, the radiator 1 may be a sintered body of the heat radiation ceramic material 10 that internally has the trivalent metal-doped metal oxide particles 12 scattered and has the monovalent metal-doped metal oxide particles 13 arranged near a surface of the heat radiation ceramic material 10. In this case, the monovalent metal-doped metal oxide particles 13 may be arranged either near the entire surface or near only a portion of the surface of the sintered body. In other words, the monovalent metal-doped metal oxide particles 13 may be arranged along at least the portion of the surface of the sintered body. A depthwise thickness of the monovalent metal-doped metal oxide particles 13 arranged near the surface is not particularly limited and may be appropriately determined with a thickness and a shape of the radiator 1 taken into consideration. For example, the depthwise thickness of the monovalent metal-doped metal oxide particles 13 arranged near the surface is preferably less than or equal to 1 mm or more preferably less than or equal to 0.5 mm. While the heat radiation ceramic material 10 in FIG. 5 internally has the trivalent metal-doped metal oxide particles 12 scattered, the trivalent metal-doped metal oxide particles 12 do not have to be included.

As illustrated in FIG. 6, the radiator 1 may be a layered structure having first layers 21 containing the trivalent metal-doped metal oxide particles 12 and second layers 22 containing the monovalent metal-doped metal oxide particles 13. The wurtzite-type metal oxide particles 11, containing the trivalent metal-doped metal oxide particles 12, form the first layer 21. The wurtzite-type metal oxide particles 11, containing the monovalent metal-doped metal oxide particles 13, form the second layer 22. A layered configuration for the layers and a thickness of each layer are not particularly limited and may be appropriately determined with the thickness and the shape of the radiator 1 taken into consideration.

The radiators 1 illustrated in FIGS. 1, 5, and 6 are the examples containing the wurtzite-type metal oxide particles 11, the trivalent metal-doped metal oxide particles 12, and the monovalent metal-doped metal oxide particles 13. However, as described above, the radiator 1 needs only to include the wurtzite-type metal oxide particles 11, and at least one of the trivalent metal-doped metal oxide particles 12 and the monovalent metal-doped metal oxide particles 13.

A porosity of the heat radiation ceramic material 10 used for the radiator 1 is associated with the thermal conductivity and mechanical strength of the radiator 1. In other words, too high a porosity of the heat radiation ceramic material 10 means that internal voids of the heat radiation ceramic material 10 connect with each other, resulting in reduced mechanical strength. Moreover, air layers defined by the voids act as heat insulators, hindering heat transfer and consequently causing a decrease in thermal conductivity. Therefore, the porosity of the heat radiation ceramic material 10 used for the radiator 1 is preferably 40% or lower from the perspective of obtaining a desired thermal conductivity and mechanical strength. The porosity of the heat radiation ceramic material 10 used for the radiator 1 is more preferably 35% or lower or even more preferably 30% or lower.

A description is provided here of the porosity of the heat radiation ceramic material 10 as used herein. The porosity can be calculated using Formula (1) below, wherein measurements of mass and dimensions of a heat radiation ceramic material 10 cut out into the shape of a rectangular parallelepiped are used. The dimensions of the rectangular parallelepiped-shaped heat radiation ceramic material 10 refer to length, width, and height.

$$\text{Porosity} = \{1 - ([W_{dry}/(L \times W \times T)/\rho_{theory}]\} \times 100 \quad (1)$$

In Formula (1), $W_{dry}$ refers to the mass [g] of the heat radiation ceramic material 10 dried at 150° C. for two hours. In Formula (1), L, W, and T refer respectively to the length [cm], width [cm], and height [cm] of the rectangular parallelepiped-shaped heat radiation ceramic material 10, and $\rho_{theory}$ refers to theoretical density [g/cm$^3$] of the heat radiation ceramic material 10.

The average emissivity of the heat radiation ceramic material 10 used for the radiator 1 is 70% or higher but is more preferably 75% or higher or even more preferably 80% or higher. The emissivity of the heat radiation ceramic material 10 generally varies with temperature. However, the heat radiation ceramic material 10, having the average emissivity of 70% or higher, provides sufficient cooling performance as the radiator 1 in a range of temperatures up to 200° C. or preferably 150° C., the range in which the radiator 1 is normally used in electrical and electronic equipment. The thermal conductivity of the heat radiation ceramic material 10 is preferably 20 W/(m·K) or higher or is more preferably 30 W/(m·K) or higher. With the thermal conductivity being 20 W/(m·K) or higher, heat generated by a heat source is efficiently transferred to the radiator 1, so even higher cooling performance can be expected.

A particle size of each of the wurtzite-type metal oxide 11, trivalent metal-doped metal oxide 12, and monovalent metal-doped metal oxide particles 13 of the radiator 1 is not particularly limited but is preferably smaller than a wavelength of infrared that radiates. Specifically, their mean particle size is preferably 15 µm or less, more preferably 10 µm or less, or even more preferably 5 µm or less. By having such a mean particle size, the radiator 1 can minimize internal radiation scattering at grain boundaries, so an even enhanced emissivity improvement effect can be expected from the radiator 1.

It is to be noted here that the mean particle size of each type of particle in the heat radiation ceramic material 10 can be obtained by observing a section of the heat radiation ceramic material 10 with a scanning electron microscope (SEM). Specifically, the heat radiation ceramic material 10 is cut, and its section is magnified, for example, by 15,000 times with the SEM. Thereafter, the longest diameter of at least 20 particles are measured, and the measurements are averaged. The mean particle size of the particles is obtained thus.

In addition to the above-described components, the heat radiation ceramic material 10 used for the radiator 1 can contain various components known in the art to obtain a desired effect. As long as the effects of the embodiment are not prevented, an amount of each of such components to be contained in the heat radiation ceramic material 10, which is used for the radiator 1 according to the first embodiment, is not particularly limited.

Figure 7:
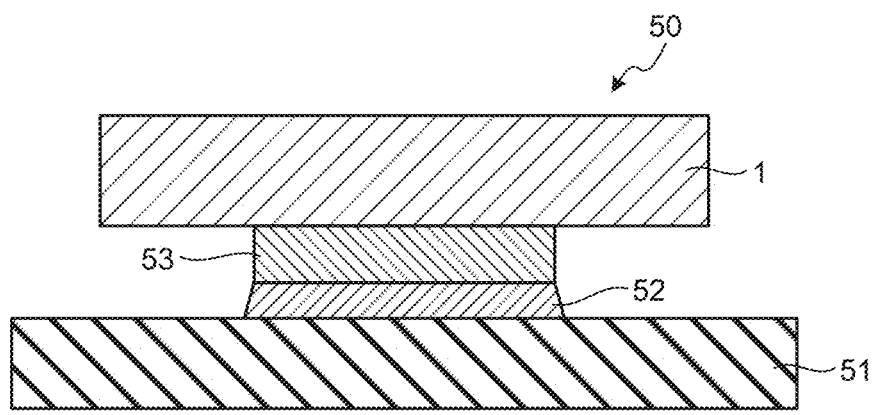
FIG. 7 is a sectional view schematically illustrating a configuration example of electrical and electronic equipment including the radiator according to the first embodiment.

The radiator 1 made of the heat radiation ceramic material 10 according to the first embodiment can be used as a heat radiation measures in the electrical and electronic equipment, and its specific uses conceivably include a heat sink, a heat spreader, and a radiation board, among others. FIG. 7 is a sectional view schematically illustrating a configuration example of the electrical and electronic equipment that includes the radiator according to the first embodiment. In this illustrated example, the radiator 1 is used as the heat sink of the electrical and electronic equipment 50. The electrical and electronic equipment 50 includes a circuit board 51, a semiconductor element 53 mounted to the circuit board 51 via a metal bonding material 52, and the radiator 1 according to the first exemplary embodiment. The radiator 1 is disposed in contact with the semiconductor element 53. The radiator 1 has the shape of a flat plate and is provided in contact with an entire face of the semiconductor element 53 that is opposite from a face closer to the circuit board 51. Such a configuration enables heat generated by the semiconductor element 53 to be efficiently discharged via the radiator 1, improving heat dissipation. Particularly when the radiator 1 is used as the heat sink, it is desirable for at least one face of the flat plate-shaped heat sink to have irregularities with an elevation difference greater than or equal to the wavelength of the infrared that radiates. The elevation difference of the irregularities is specifically 25 µm or more. The elevation difference of the irregularities is preferably 30 µm or more. Since the face of the radiator 1 is provided with the irregularities having the elevation difference greater than or equal to the infrared wavelength, an effective surface area for infrared radiation is increased. This leads to an improved apparent average emissivity and an improvement in cooling performance of the heat sink.

A description is provided next of a method of manufacturing the radiator 1. The radiator 1 according to the first embodiment can be manufactured using methods known in the art. For example, the radiator 1 according to the first embodiment can be manufactured in the following way.

Performed first is a slurry preparation step in which a slurry is prepared by mixing ZnO powder, alumina ($Al_2O_3$) powder, lithium carbonate ($Li_2CO_3$) powder, a dispersant, a binder, and water. A mean particle size of the ZnO powder, the $Al_2O_3$ powder, and the $Li_2CO_3$ powder is not particularly limited but is preferably 1 µm or less, more preferably 0.8 µm or less, or even more preferably 0.5 µm or less. If the mean particle size of each type of powder is greater than 1 µm, a homogeneous composition is difficult to obtain because unreacted atoms are more likely to remain during substitution reaction in which Zn atoms in ZnO are substituted with Al or Li atoms. This may prevent cooling performance improvement of the radiator 1 to be manufactured.

The dispersant to be used is not particularly limited as long as the dispersant is usable for the slurry that is aqueous and can be a dispersant known in the art. Examples of the dispersant include anionic surfactants such as alkyl sulfate ester salts, polyoxyethylene alkyl ether sulfate ester salts, alkylbenzene sulfonates, reactive surfactants, fatty acid salts, and naphthalenesulfonate formalin condensates; cationic surfactants such as alkylamine salts, quaternary ammonium salts, alkyl betaines (amphoteric surfactants), and alkylamine oxides (amphoteric surfactants); and nonionic surfactants such as polyoxyethylene alkyl ethers, polyoxyalkylene derivatives, sorbitan fatty acid esters, polyoxyethylene sorbitan fatty acid esters, polyoxyethylene sorbitol fatty acid esters, glycerine fatty acid esters, polyoxyethylene fatty acid esters, polyoxyethylene fatty acid castor oil, polyoxyethylene alkylamines, and alkyl alkanolamides. These can be used alone, or a combination of two or more of these types can be used.

The binder to be used is not particularly limited and can be a binder known in the art. Examples of the binder include acrylic resins, cellulose resins, polyvinyl alcohol resins, polyvinyl acetal resins, urethane resins, and vinyl acetate resins. These can be used alone, or a combination of two or more of these types can be used.

The water to be used is not particularly limited and can be, for example, pure water, reverse osmosis (RO) water, or deionized water.

A mixing method to be used when preparing the slurry is not particularly limited and can be a method known in the art. The mixing method is, for example, a method using a kneader, a ball mill, a planetary ball mill, a kneading mixer, or a bead mill.

Performed next is a granulated powder preparation step in which granulated powder is prepared by granulating the slurry. A granulation method is not particularly limited, but the granulation can be done according to a method known in the art. For example, the granulated powder can be obtained through spray drying using a spray dryer or the like. Conditions for the spray drying need only to be appropriately adjusted according to the equipment used and are not particularly limited.

Performed next is a molded body preparation step in which a mold with a desired shape is filled with the granulated powder and is then subjected to pressure molding to make a molded body. In cases where the radiator 1 is used as a heat sink, the desired shape is, for example, a flat plate shape. A pressure molding method is not particularly limited. The pressure molding can be done according to a method known in the art. Examples of the pressure molding method include cold isostatic pressing (CIP), warm isostatic pressing (WIP), and uniaxial pressing.

A pressure to be applied during the pressure molding needs only to be appropriately adjusted according to the type of granulated powder, equipment used, and others. Although not particularly limited, the pressure to be applied generally ranges from 30 Mpa to 500 MPa inclusive.

Performed thereafter is a degreasing step in which the molded body is degreased. A degreasing method is not particularly limited. The degreasing can be done according to a method known in the art. For example, the degreasing can be performed by heat-treating the molded body in an air atmosphere. As long as the binder can be thermally decomposed, a heating temperature is not particularly limited but generally ranges from 300° C. to 800° C. inclusive.

Performed next is a firing step in which the degreased molded body is fired. A firing method is not particularly limited, but the firing can be done according to a method known in the art. For example, the degreased molded body is fired in an air atmosphere. A firing temperature is not particularly limited but generally ranges from 1100° C. to 1500° C. inclusive, preferably ranges from 1200° C. to 1400° C. inclusive, or more preferably ranges from 1250° C. to 1350° C. inclusive.

A grinding step may be performed afterward to grind a surface of the fired molded body to a refined shape. A grinding method is not particularly limited. The grinding can be done according to a method known in the art. The grinding method is, for example, grinding using a diamond tool.

In the above manner, the radiator 1 of FIG. 1 in which the trivalent metal-doped metal oxide particles 12 and the monovalent metal-doped metal oxide particles 13 are scattered among the wurtzite-type metal oxide particles 11 is manufactured.

A description is provided of a method of manufacturing the radiator 1 of FIG. 5 that internally has the trivalent metal-doped metal oxide particles 12 scattered and has the monovalent metal-doped metal oxide particles 13 arranged near the surface of the sintered body. A slurry with a composition formulated without the $Li_2CO_3$ powder is prepared in the slurry preparation step, and as described above, the granulated powder preparation step and the subsequent steps are performed, thus making a fired molded body.

Performed next is a $Li_2CO_3$ powder application step in which the $Li_2CO_3$ powder is applied to a surface of the fired molded body obtained. The $Li_2CO_3$ powder is applied to at least a portion of the surface of the molded body here. Performed next is a heat treatment step in which the molded body having the $Li_2CO_3$ powder coating on its surface is heat-treated in an air atmosphere with an electric furnace. A heat treatment temperature only needs to be a temperature sufficient to cause thermal decomposition of the $Li_2CO_3$ powder and thermal diffusion of lithium atoms into ZnO. In the above manner, the radiator 1 illustrated in FIG. 5 is manufactured.

A description is provided of a method of manufacturing the radiator 1 of FIG. 6 that has the first layers 21 containing the trivalent metal-doped metal oxide particles 12 and the second layers 22 containing the monovalent metal-doped metal oxide particles 13 in the layered structure. In this case, a slurry formulated without the $Li_2CO_3$ powder and a slurry formulated without the $Al_2O_3$ powder are prepared in the slurry preparation step. In the granulated powder preparation step, granulated powder is made by granulating the slurry formulated without the $Li_2CO_3$ powder, and granulated powder is made by granulating the slurry formulated without the $Al_2O_3$ powder. In the molded body preparation step that follows, a mold with a desired shape is alternately filled with predetermined quantities of granulated powder without $Li_2CO_3$ particles and predetermined quantities of granulated powder without $Al_2O_3$ powder particles and is then subjected to pressure molding to make a molded body. Thereafter, as described above, the degreasing step and the subsequent steps are performed, thus making a fired molded body.

The radiator 1 illustrated in FIG. 6 can also be manufactured by another method. For example, green sheets made of the slurry formulated without the $Li_2CO_3$ powder and green sheets made of the slurry formulated without the $Al_2O_3$ powder are made with a known method. The green sheet refers to an unfired sheet that contains powdered materials included in the ceramic material as components. The green sheets without the $Li_2CO_3$ powder and the green sheets without the $Al_2O_3$ powder are alternately stacked and then degreased and fired.

The radiator 1 according to the first embodiment includes the wurtzite-type metal oxide 100 as the principal component and at least one of the trivalent metal-doped metal oxide 110 with the average emissivity of 70% or higher in the wavelength range of 3 μm to 25 μm inclusive and the monovalent metal-doped metal oxide 120 with the average emissivity of 70% or higher in the wavelength range of 3 μm to 25 μm inclusive. The wurtzite-type metal oxide 100 has the electronic structure that provides the high emissivity in the wavelength range of 3 μm to 25 μm inclusive. The inclusion of the trivalent metal-doped metal oxide 110 in the radiator 1 results in the altered electronic structure of the wurtzite-type metal oxide 100, thus improving the emissivity on the shorter-wavelength side of the infrared range, namely at the wavelengths of up to 10 μm. The inclusion of the monovalent metal-doped metal oxide 120 in the radiator 1 results in the altered electronic structure of the wurtzite-type metal oxide 100, thus improving the emissivity on the longer-wavelength side of the infrared range, namely at the wavelengths of 10 μm and above. Therefore, the radiator 1 obtained has the improved average emissivity in the wavelength range of 3 μm to 25 μm inclusive and excellent cooling performance compared to conventional ones.

Second Embodiment

Figure 8:
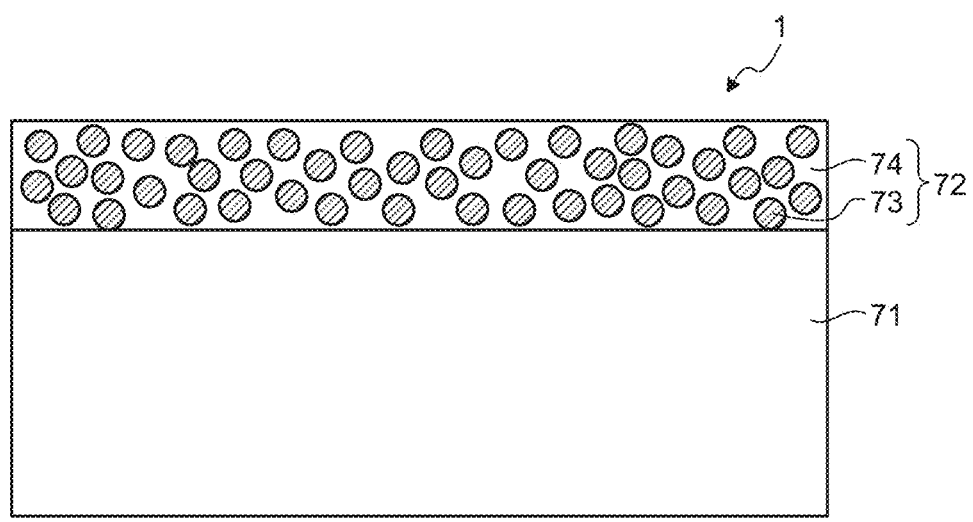
FIG. 8 is a sectional view schematically illustrating a configuration example of a radiator according to a second embodiment.

FIG. 8 is a sectional view schematically illustrating a configuration example of a radiator according to a second embodiment. A description is provided of what is different from the first embodiment. Constituent elements identical with those in the first embodiment have the same reference characters and are not described.

The radiator 1 according to the second embodiment includes a base 71 and a coating layer 72 as a coating on a surface of the base 71. The coating layer 72 includes the heat radiation ceramic material 10. The coating layer 72 contains a filler 73 and a binder 74.

Figure 9:
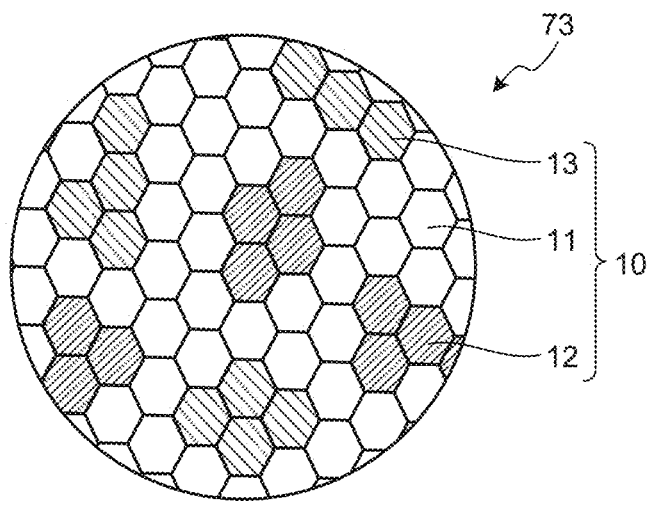
FIG. 9 is a sectional view schematically illustrating a configuration example of a filler in a radiator according to the second embodiment.
Figure 10:
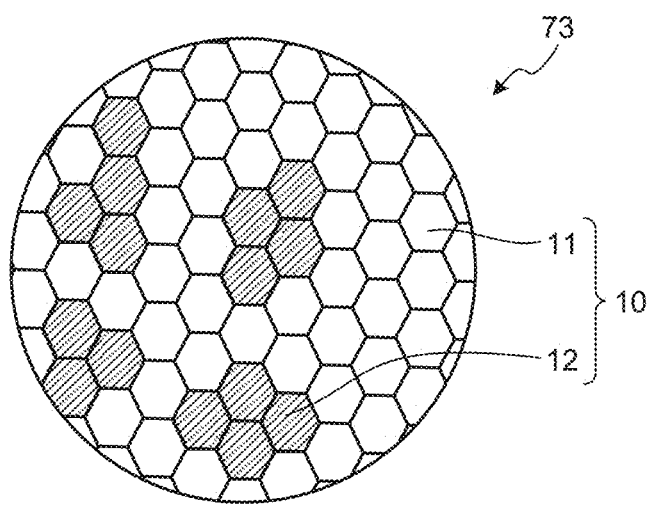
FIG. 10 is a sectional view schematically illustrating a configuration example of the filler in the radiator according to the second embodiment.
Figure 11:
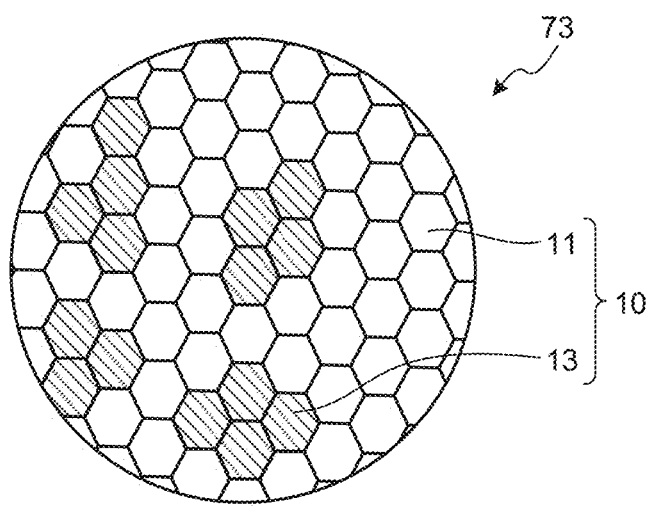
FIG. 11 is a sectional view schematically illustrating a configuration example of the filler in the radiator according to the second embodiment.

As with the heat radiation ceramic material 10 used for the radiator 1 according to the first embodiment, the filler 73 includes the wurtzite-type metal oxide particles 11 as a principal component and at least one of the trivalent metal-doped metal oxide particles 12 and the monovalent metal-doped metal oxide particles 13. The wurtzite-type metal oxide particles 11 have the relatively high emissivity. The trivalent metal-doped and monovalent metal-doped metal oxide particles 12 and 13 have the different radiation spectra. FIGS. 9 to 11 are sectional views schematically illustrating configuration examples of the filler as the radiator according to the second embodiment. The filler 73 illustrated in FIG. 9 is made of the heat radiation ceramic material 10 that includes the wurtzite-type metal oxide particles 11, the trivalent metal-doped metal oxide particles 12, and the monovalent metal-doped metal oxide particles 13. The filler 73 illustrated in FIG. 10 is made of a heat radiation ceramic material 10 that includes the wurtzite-type metal oxide particles 11 and the trivalent metal-doped metal oxide particles 12. The filler 73 illustrated in FIG. 11 is made of a heat radiation ceramic material 10 that includes the wurtzite-type metal oxide particles 11 and the monovalent metal-doped metal oxide particles 13. The fillers 73 made of the heat radiation ceramic materials 10 illustrated in FIGS. 9 to 11 may be used alone, or a combination of two or more types of fillers 73 may be used. Similarly to the heat radiation ceramic material 10 used for the radiator 1 according to the first embodiment, from the perspective of improvement of an average emissivity of the radiator 1, the trivalent metal-doped metal oxide particles 12 is more preferably included, and both the monovalent metal-doped and trivalent metal-doped metal oxide particles 13 and 12 are even more preferably included.

The binder 74 contained in the coating layer 72 is not particularly limited and needs only to have a capability to uniformly disperse and stabilize the filler 73 of the heat radiation ceramic material 10 in the coating layer 72. For the binder 74 contained in the coating layer 72, an appropriately selected organic or inorganic binder, for example, can be used. One criterion for selecting the binder 74 is heat resistance. In other words, the binder 74 with a desired heat resistance is appropriately selected depending on temperature at which the radiator 1 is used.

While the organic binder is not particularly limited, examples of the organic binder include epoxy resins, unsaturated polyester resins, phenol resins, melamine resins, silicone resins, and polyimide resins, among others. Among these, the epoxy resins are preferable because of their excellent adhesiveness. Examples of the epoxy resins include bisphenol A-type epoxy resins, bisphenol F-type epoxy resins, ortho-cresol novolac epoxy resins, phenol novolac epoxy resins, alicyclic aliphatic epoxy resins, and glycidyl-aminophenol epoxy resins, among others. These resins can be used alone, or a combination of two or more of these types can be used.

When the epoxy resin is used as a thermosetting resin, examples of a curing agent include, among others, alicyclic anhydrides such as methyltetrahydrophthalic anhydride, methylhexahydrophthalic anhydride, and himic anhydride; aliphatic anhydrides such as dodecenyl succinic anhydride; aromatic anhydrides such as phthalic anhydride and trimellitic anhydride; organic dihydrazides such as dicyandiamide and adipic acid dihydrazide; tris(dimethylaminomethyl)phenol; dimethylbenzylamine; 1,8-diazabicyclo(5,4,0)-undecene and its derivatives; and imidazoles such as 2-methylimidazole, 2-ethyl-4-methylimidazole, and 2-phenylimidazole. These curing agents can be used alone, or a combination of two or more of these types can be used.

An amount of curing agent in a formulation is appropriately set according to the thermosetting resin to be used, the type of curing agent, and others but generally ranges from 0.1 parts by mass to 200 parts by mass (inclusive) per 100 parts by mass of the thermosetting resin.

The coating layer 72 of the radiator 1 may contain a coupling agent from the perspective of improvement of interfacial adhesion between the filler 73, which is made of the heat radiation ceramic material 10, and the cured thermosetting resin. Examples of the coupling agent include γ-glycidoxypropyltrimethoxysilane, N-β(aminoethyl)γ-aminopropyltriethoxysilane, N-phenyl-γ-aminopropyltrimethoxysilane, and γ-mercaptopropyltrimethoxysilane, among others. These coupling agents can be used alone, or a combination of two or more of these types can be used.

An amount of coupling agent in a formulation is appropriately set according to the thermosetting resin to be used, the type of coupling agent, and others. The amount of coupling agent in the formulation generally ranges from 0.01 parts by mass to 1 part by mass (inclusive) per 100 parts by mass of the thermosetting resin.

The inorganic binder is preferably a liquid binder that has good compatibility with the filler 73, which is made of the heat radiation ceramic material 10, and is capable of uniform dispersion. While many inorganic binders have higher curing temperatures than organic binders, the curing temperature of the inorganic binder is 250° C. or lower from the perspective of workability and prevention of base deterioration from heat treatment. The curing temperature of the inorganic binder is preferably 200° C. or lower or more preferably 180° C. or lower. Such an inorganic binder, if used, enables efficient formation of the coating layer 72 with no thermal deterioration of the base 71. Examples of the inorganic binder include, but not particularly limited to, sol-gel glass, organic-inorganic hybrid glass, water glass, one-component inorganic adhesives, and two-component inorganic adhesives, among others. These can be used alone, or a combination of two or more of these types can be used.

The base 71 of the radiator 1 is not particularly limited but is preferably made of a metal or a ceramic that has a higher thermal conductivity from the perspective of efficient transfer of heat of a heat source. Examples of the metal include Al, copper (Cu), stainless steel, iron (Fe), and other alloys. Examples of the ceramic include $Al_2O_3$, magnesia (MgO), zirconia ($ZrO_2$), aluminum nitride (AlN), and silicon carbide (SiC). These can be used alone, or a combination of two or more of these types can be used.

The radiator 1 according to the second embodiment includes the base 71 and the coating layer 72 containing the filler 73, which is made of the heat radiation ceramic material 10 having the improved average emissivity in the wavelength range of 3 μm to 25 μm inclusive. The filler 73 includes the wurtzite-type metal oxide particles 11 as the principal component and the at least one of the trivalent metal-doped metal oxide particles 12 and the monovalent metal-doped metal oxide particles 13. The wurtzite-type metal oxide particles 11 have the relatively high emissivity. The trivalent metal-doped and monovalent metal-doped metal oxide particles 12 and 13 have the different radiation spectra. Therefore, the radiator 1 obtained is advantageous in that the average emissivity is high and the cooling performance is excellent compared to conventional ones.

EXAMPLES

A detailed description is hereinafter provided of radiators 1 according to Examples and Comparative Examples; however, these do not limit the scope of the present disclosure.

Example 1

Materials included are ZnO powder and $Al_2O_3$ powder. The ZnO powder has a mean particle size of 1 μm, and the $Al_2O_3$ powder has a mean particle size of 1 μm. The ZnO powder and the $Al_2O_3$ powder are blended in a ratio of 97.43 parts by mass to 2.57 parts by mass. To 100 parts by mass of the base powder, 1 part by mass of polyoxyethylene lauryl ether as a dispersant, 1 part by mass of polyvinyl alcohol as a binder, and 50 parts by mass of water are added and mixed for about five hours with a ball mill, thus preparing a slurry.

Next, granulated powder is obtained by spray-drying the obtained slurry with a spray dryer. Thereafter, a molded body is obtained by filling a radome-shaped mold with the obtained granulated powder, followed by CIP molding using a cold isostatic pressing machine. An applied pressure is 98 MPa.

Next, degreasing is performed by heat-treating the obtained molded body at 600° C. for two hours in an air atmosphere. Thereafter, the degreased molded body is fired at 1300° C. for six hours in a nitrogen atmosphere. In the above manner, the radiator 1 made of a heat radiation ceramic material 10 is made. The heat radiation ceramic material 10 thus made has an amount of trivalent metal substitution of 2 mol %.

Example 2

Example 2 is similar to Example 1 except that 99.87 parts by mass of the ZnO powder and 0.13 parts by mass of the $Al_2O_3$ powder are blended as materials. A heat radiation ceramic material 10 thus made has an amount of trivalent metal substitution of 0.1 mol %.

Example 3

Example 3 is similar to Example 1 except that 99.34 parts by mass of the ZnO powder and 0.66 parts by mass of the $Al_2O_3$ powder are blended as materials. A heat radiation ceramic material 10 thus made has an amount of trivalent metal substitution of 0.5 mol %.

Example 4

Example 4 is similar to Example 1 except that 93.81 parts by mass of the ZnO powder and 6.19 parts by mass of the $Al_2O_3$ powder are blended as materials. A heat radiation ceramic material 10 thus made has an amount of trivalent metal substitution of 5 mol %.

Example 5

Example 5 is similar to Example 1 except that 91.55 parts by mass of the ZnO powder and 8.45 parts by mass of the $Al_2O_3$ powder are blended as materials. A heat radiation ceramic material 10 thus made has an amount of trivalent metal substitution of 7 mol %.

Example 6

Example 6 is similar to Example 1 except that 98.59 parts by mass of the ZnO powder and 1.41 parts by mass of $Li_2CO_3$ powder instead of the $Al_2O_3$ powder are blended as materials. A heat radiation ceramic material 10 thus made has an amount of monovalent metal substitution of 3 mol %.

Example 7

Example 7 is similar to Example 1 except that 99.90 parts by mass of the ZnO powder and 0.10 parts by mass of the $Li_2CO_3$ powder instead of the $Al_2O_3$ powder are blended as materials. A heat radiation ceramic material 10 thus made has an amount of monovalent metal substitution of 0.2 mol %.

Example 8

Example 8 is similar to Example 1 except that 95.44 parts by mass of the ZnO powder and 4.56 parts by mass of the $Li_2CO_3$ powder instead of the $Al_2O_3$ powder are blended as materials. A heat radiation ceramic material 10 thus made has an amount of monovalent metal substitution of 10 mol %.

Example 9

Example 9 is similar to Example 1 except that 94.58 parts by mass of the ZnO powder and 5.42 parts by mass of the $Li_2CO_3$ powder instead of the $Al_2O_3$ powder are blended as materials. A heat radiation ceramic material 10 thus made has an amount of monovalent metal substitution of 12 mol %.

Example 10

Example 10 is similar to Example 1 except that 96.09 parts by mass of the ZnO powder, 2.53 parts by mass of the $Al_2O_3$ powder, and 1.38 parts by mass of the $Li_2CO_3$ powder are blended as materials. A heat radiation ceramic material 10 thus made has an amount of trivalent metal substitution of 2 mol % and an amount of monovalent metal substitution of 3 mol %.

Comparative Example 1

Comparative Example 1 is similar to Example 1 except that 100 parts by mass of the ZnO powder and 0 parts by mass of the $Al_2O_3$ powder are blended as materials.

Comparative Example 2

Comparative Example 2 is similar to Example 1 except that 0 parts by mass of the ZnO powder and 100 parts by mass of the $Al_2O_3$ powder are blended as materials.

The porosity is measured for each of the radiators 1 made respectively of the heat radiation ceramic materials 10 obtained according to above Examples 1 to 10 and Comparative Examples 1 and 2. The porosity is calculated with the above-described method.

For each of the radiators 1 made respectively of the heat radiation ceramic materials 10 obtained according to above Examples 1 to 10 and Comparative Examples 1 and 2, (1) cooling performance of the radiator 1 and (2) the average emissivity are evaluated.

(1) Cooling Performance of Radiator 1

A ceramic heater is attached to one face of the heat radiation ceramic material 10 that is 100 mm long, 100 mm wide, and 7 mm thick. A power of 20 W is continuously applied to the attached ceramic heater for several hours until the heat radiation ceramic material 10 and the ceramic heater reached a saturation temperature. Thereafter, surface temperature of the ceramic heater is measured with a thermocouple. The saturation temperature of the ceramic heater for the power input of 20 W indicates the cooling performance of the radiator 1. A lower saturation temperature indicates a higher cooling performance of the radiator 1.

(2) Average Emissivity

The average emissivity is determined by measuring emissivities in the wavelength range of 3 μm to 25 μm inclusive with an emissivity measurement device and calculating an average of the emissivities in the entire wavelength range. A test piece used here is cut out of the heat radiation ceramic material 10 and is 20 mm long, 20 mm wide, and 2 mm thick.

FIG. 12 is a diagram illustrating the example materials, the example heat radiation ceramic materials, and example heat radiation characteristics of the radiators according to Examples 1 to 10 and Comparative Examples 1 and 2. Section "Materials" shows mass percentages of the ZnO powder, the $Al_2O_3$ powder, and the $Li_2CO_3$ powder of the base powder and parts by mass of the dispersant, the binder, and water relative to 100 parts by mass of the base powder. Section "Heat radiation ceramic material" 10 shows the amount of trivalent metal substitution [mol %], the amount of monovalent metal substitution [mol %], and the porosity [%]. Section "Heat radiation performance" shows results of the following two evaluation items. The two evaluation items are the average emissivity [%] of the heat radiation ceramic material 10 in the wavelength range of 3 μm to 25 μm inclusive and the cooling performance of the radiator 1, namely the saturation temperature [° C.] for the power input of 20 W.

As illustrated in FIG. 12, the radiators 1 according to Examples 1 to 10 each has a high average emissivity of 70A or higher. Furthermore, saturation temperatures for the power input of 20 W fell within a range of 116° C. to 139° C. inclusive. The higher the average emissivity among the radiators 1 according to Examples 1 to 10, the better the cooling performance of the radiator 1. In Example 10 in which some Zn atoms in ZnO are substituted with both the trivalent and monovalent metals, the average emissivity is 83%, the highest among Examples 1 to 10. In other words, the radiator 1 has the improved cooling performance compared to when some Zn atoms in ZnO are substituted with the trivalent metal or the monovalent metal.

In the radiator 1 according to Comparative Example 1, in contrast, some Zn atoms in ZnO are not substituted with the trivalent and monovalent metals. In this condition, the average emissivity is 61%. This low average emissivity causes reduced cooling performance of the radiator 1.

For the radiator 1 according to Comparative Example 2, $Al_2O_3$ is the only constituent material, and no ZnO is contained as a principal component. Therefore, the average emissivity is low, and the radiator 1 has reduced cooling performance, too.

As indicated above, by using the wurtzite-type metal oxide 100 as the principal component and including at least one of the trivalent metal-doped metal oxide 110 and the monovalent metal-doped metal oxide 120, the wavelength range in which the high average emissivity is exhibited is widened, resulting in increased heat radiation. This means that the resulting radiator 1 has an average emissivity of 70% or higher and excellent cooling performance. In addition, if such a heat radiation ceramic material 10 is used, a heat sink that has an average emissivity of 70% or higher and excellent cooling performance can be obtained.

The above configurations illustrated in the embodiments are illustrative, can be combined with other techniques that are publicly known, and can be partly omitted or changed without departing from the gist. The embodiments can be combined with each other.

REFERENCE SIGNS LIST 1 radiator; 10 heat radiation ceramic material; 11 metal oxide particles; 12 trivalent metal-doped metal oxide particles; 13 monovalent metal-doped metal oxide particles; 21 first layer; 22 second layer; 50 electrical and electronic equipment; 51 circuit board; 52 metal bonding material; 53 semiconductor element; 71 base; 72 coating layer; 73 filler; 74 binder; 100 wurtzite-type metal oxide; 101 metal atom; 102 oxygen atom; 110 trivalent metal-doped metal oxide; 111 trivalent metal atom; 120 monovalent metal-doped metal oxide; 121 monovalent metal atom.

The invention claimed is:

1. A radiator comprising a heat radiation ceramic material, wherein
the heat radiation ceramic material includes:
a first metal oxide as a principal component, the first metal oxide being a metal oxide having a wurtzite crystal structure; and
a second metal oxide as a metal oxide having an average emissivity higher than or equal to 70% in a wavelength range of 3 μm to 25 μm inclusive, wherein
the second metal oxide includes at least one of a trivalent metal-doped metal oxide where some metal atoms of the first metal oxide are substituted with trivalent metal atoms and a monovalent metal-doped metal oxide where some metal atoms of the first metal oxide are substituted with monovalent metal atoms.

2. The radiator according to claim 1, wherein
the first metal oxide is ZnO.

3. The radiator according to claim 1, wherein
when the second metal oxide includes the trivalent metal-doped metal oxide, the trivalent metal atoms are Al or Ga.

4. The radiator according to claim 1, wherein
when the second metal oxide includes the monovalent metal-doped metal oxide, the monovalent metal atoms are Li or Na.

5. The radiator according to claim 1, wherein
when the second metal oxide includes the trivalent metal-doped metal oxide and the monovalent metal-doped metal oxide,
the trivalent metal atoms are Al or Ga, and
the monovalent metal atoms are Li or Na.

6. The radiator according to claim 1, wherein
the heat radiation ceramic material is a sintered body including:
first metal oxide particles as particles of the first metal oxide; and
second metal oxide particles as particles of the second metal oxide.

7. The radiator according to claim 3, wherein
the heat radiation ceramic material is a sintered body including:
first metal oxide particles as particles of the first metal oxide; and
trivalent metal-doped metal oxide particles as particles of the trivalent metal-doped metal oxide.

8. The radiator according to claim 4, wherein
the heat radiation ceramic material is a sintered body including:
first metal oxide particles as particles of the first metal oxide; and
monovalent metal-doped metal oxide particles as particles of the monovalent metal-doped metal oxide.

9. The radiator according to claim 5, wherein
the heat radiation ceramic material is a sintered body including:
first metal oxide particles as particles of the first metal oxide;
trivalent metal-doped metal oxide particles as particles of the trivalent metal-doped metal oxide; and
monovalent metal-doped metal oxide particles as particles of the monovalent metal-doped metal oxide.

10. The radiator according to claim 8, wherein
at least a portion of a surface of the heat radiation ceramic material as the sintered body is where the monovalent metal-doped metal oxide particles are disposed.

11. The radiator according to claim 9, wherein
the heat radiation ceramic material is a stack of:
a first layer formed by the first metal oxide particles containing the trivalent metal-doped metal oxide particles; and
a second layer formed by the first metal oxide particles containing the monovalent metal-doped metal oxide particles.

12. The radiator according to claim 1, further comprising:
a base; and
a coating layer as a coating on a surface of the base, wherein
the heat radiation ceramic material is included in the coating layer.

13. The radiator according to claim 12, wherein the coating layer includes a filler and a binder, the filler is made of the heat radiation ceramic material.

14. A heat sink comprising the radiator according to claim 1.

15. The heat sink according to claim 14, wherein
the radiator includes irregularities having an elevation difference greater than or equal to 25 µm at a face.

16. The radiator according to claim 9, wherein
at least a portion of a surface of the heat radiation ceramic material as the sintered body is where the monovalent metal-doped metal oxide particles are disposed.

* * * * *